United States Patent
Bürgi et al.

(10) Patent No.: US 8,343,779 B2
(45) Date of Patent: Jan. 1, 2013

(54) METHOD FOR FORMING A PATTERN ON A SUBSTRATE AND ELECTRONIC DEVICE FORMED THEREBY

(75) Inventors: Lukas Bürgi, Zürich (CH); Reto Pfeiffer, Pfäffikon (CH); Harald Walter, Horgen (CH); Adrian Von Mühlenen, Zofingen (CH)

(73) Assignee: BASF SE, Ludwigshafen (DE)

( * ) Notice: Subject to any disclaimer, the term of this patent is extended or adjusted under 35 U.S.C. 154(b) by 397 days.

(21) Appl. No.: 12/594,352

(22) PCT Filed: Apr. 10, 2008

(86) PCT No.: PCT/CH2008/000163
§ 371 (c)(1),
(2), (4) Date: Jan. 29, 2010

(87) PCT Pub. No.: WO2008/128365
PCT Pub. Date: Oct. 30, 2008

(65) Prior Publication Data
US 2010/0148159 A1   Jun. 17, 2010

(30) Foreign Application Priority Data
Apr. 19, 2007   (EP) .................................. 07007990

(51) Int. Cl.
*H01L 21/00* (2006.01)
(52) U.S. Cl. ............ 438/9; 438/152; 438/155; 438/474; 257/40; 257/66; 257/E29.277
(58) Field of Classification Search .................... 257/40, 257/66, E29.277; 438/9, 152, 155, 474
See application file for complete search history.

(56) References Cited

U.S. PATENT DOCUMENTS
3,134,516 A    5/1964   Aagaard
(Continued)

FOREIGN PATENT DOCUMENTS
EP    0953420 A2    11/1999
(Continued)

OTHER PUBLICATIONS
Y. Mikami, IEEE Transactions on Electron Devices 41, 306 (1994).
(Continued)

*Primary Examiner* — Benjamin Sandvik
*Assistant Examiner* — Scott R Wilson
(74) *Attorney, Agent, or Firm* — Shiela A. Loggins

(57) ABSTRACT

The invention relates to a method for forming a pattern on a substrate (S) with an upper surface and a lower surface which comprises the steps of depositing a first layer (E1) of an opaque material on the upper surface of the substrate (S), depositing a photosensitive layer (R) such that part of the photosensitive layer (R) covers at least part of the first layer (E1), exposing the photosensitive layer (R) to a light beam (L), the light beam (L) impinging on the lower surface of the substrate (S) under an oblique angle (Φ) of incidence, removing the exposed region of the photosensitive layer (R), depositing a second layer (E2) of an opaque material such that part of the second layer (E2) covers a remaining region of the photosensitive layer (R), and removing at least a part of the remaining region of the photosensitive layer (R). According to another aspect of the method of the invention anisotropic plasma etching is applied from above the upper surface of the substrate (S) after removal of the exposed region of the photosensitive layer (R) and thereafter the second layer (E2) is deposited. The method of the invention can be applied for forming a source electrode and a drain electrode of a thin-film field effect transistor. The invention furthermore relates to an electronic device fabricated by such a method.

15 Claims, 14 Drawing Sheets

U.S. PATENT DOCUMENTS

| | | | |
|---|---|---|---|
| 5,523,192 | A | 6/1996 | Blanchet-Fincher |
| 5,772,905 | A | 6/1998 | Chou |
| 6,207,472 | B1 | 3/2001 | Challegari et al. |
| 6,322,736 | B1 | 11/2001 | Bao et al. |
| 6,946,332 | B2 | 9/2005 | Loo et al. |
| 7,176,040 | B2 | 2/2007 | Sirringhaus et al. |
| 7,244,669 | B2 | 7/2007 | Sirringhaus et al. |
| 7,407,849 | B2 | 8/2008 | Sirringhaus et al. |
| 7,571,529 | B2 | 8/2009 | Sirringhaus et al. |
| 2003/0059987 | A1 | 3/2003 | Sirringhaus et al. |
| 2005/0163932 | A1 | 7/2005 | Zschieschang et al. |
| 2005/0173049 | A1 | 8/2005 | Dona et al. |
| 2006/0128165 | A1 | 6/2006 | Theiss et al. |
| 2007/0012950 | A1 | 1/2007 | Cain et al. |
| 2007/0018151 | A1 * | 1/2007 | Sirringhaus et al. ............ 257/40 |
| 2008/0182358 | A1 * | 7/2008 | Cowdery-Corvan et al. . 438/104 |
| 2009/0038683 | A1 | 2/2009 | Walter |

FOREIGN PATENT DOCUMENTS

| | | | |
|---|---|---|---|
| EP | 1727220 | A2 | 11/2006 |
| JP | 60050535 | | 3/1985 |
| JP | 63226071 | | 9/1988 |
| JP | 63226071 | A * | 9/1988 |
| JP | 2006114817 | | 10/2004 |
| WO | 9909603 | A1 | 2/1999 |
| WO | 0146987 | A2 | 6/2001 |
| WO | 0229912 | A1 | 4/2002 |
| WO | 02070721 | A2 | 9/2002 |
| WO | 02095805 | A2 | 11/2002 |
| WO | 03056641 | A1 | 7/2003 |
| WO | 03099463 | A2 | 12/2003 |
| WO | 2004004025 | A2 | 1/2004 |
| WO | 2004021751 | A1 | 3/2004 |
| WO | 2004087434 | A1 | 10/2004 |
| WO | 2005038881 | A2 | 4/2005 |
| WO | 2007020442 | A2 | 2/2007 |

OTHER PUBLICATIONS

D. Zielke et al, Applied Physics Letters 87, 123508 (2005).
T. Mäkelä et al., Synthetic Metals 153, 285 (2005).
N. Stutzmann et al., Science 299, 1881 (2003).
U. Zschieschang et al., Advanced Materials 15, 1147 (2003).
B. Groman et al Chemical Materials 7, 526 (1995)).
M. Leufgen et al., Applied Physics Letters 84, 1582 (2004).
J. Schellekens et al., Materials Research Society Symposium Proceedings EXS-2. M2.9.1 (2004).
E. Kim et al., Applied Physics Letters 80, 4051 (2002).
T. Wang et al., Advanced Materials 15, 1009 (2003).
M. M. J. Decré et al., Materials Research Society Symposium Proceedings EXS-2. M4.9.1. (2004).
Sato et al., Journal of Applied Physics, vol. 43, No. 12, pp. 8341-8344.
Patent Abstracts of Japan 60050535.
Patent Abstracts of Japan 6322071.
Patent Abstracts of Japan 2006114817.
English Language Abstract of WO2004004025 printed on Nov. 24, 2009.

* cited by examiner a)

b)

United States Patent US 8,343,779 B2

METHOD FOR FORMING A PATTERN ON A SUBSTRATE AND ELECTRONIC DEVICE FORMED THEREBY

CROSS REFERENCES TO RELATED APPLICATIONS

This application claims the priority of European patent application 07 007 990.0, filed on Apr. 19, 2007, the disclosure of which is incorporated herein by reference in its entirety.

TECHNICAL FIELD

The invention relates to a method for forming a pattern on a substrate and to an electronic device formed thereby. The electronic device may in particular be an organic electronic device.

BACKGROUND ART

For forming patterns in structures in the micrometer and sub-micrometer range for electronic and micro technology applications usually methods relying on electron beam, X-ray, ion beam and optical lithography are employed. With these lithographic methods a resolution of 1 micrometer or better can be achieved. The methods are based on a step-and-repeat process and are thus not compatible with continuous in-line manufacturing. At the moment, a throughput of $10^{-3}$ m$^2$/s, which corresponds to 50,000 300 millimeter wavers per month, can be achieved with these lithographic methods, the required equipment being rather expensive.

Traditional high-throughput print technologies such as offset, flexography, and gravure—a type of intaglio print process—have been employed for patterning and forming electronic circuits. Offset printed transistors have been reported in Y. Mikami, IEEE Transactions on Electron Devices 41, 306 (1994) and by D. Zielke et al, Applied Physics Letters 87, 123508 (2005), for example. Transistors structured by flexographic printing have been reported by T. Mäkelä et al., Synthetic Metals 153, 285 (2005). An intaglio print process is disclosed in WO 2004/021751 A1. Processes employing these print technologies offer a throughput of several m$^2$/s but their resolution is currently limited to 20 micrometers or more, which is usually not sufficient for electronic applications.

Another known method for forming patterns with nanometer resolution on a substrate is the so-called nanoimprint lithography (NIL) (e.g. U.S. Pat. No. 5,772,905 A). Nanoimprint lithography is a process wherein a mould is is pressed into an imprint polymer. Nanoimprint lithography allows in principle for parallel, arbitrarily complex patterning with less than 10 nanometer resolution. The imprinted polymer layer is usually used as an etch resist in a subsequent process step and the pattern is transferred into an underlying layer by etching. Typically, the mould has to be reconditioned or even replaced after a fairly limited number of imprint processes. Furthermore, during the imprint process, material is usually flowing from the raised regions of the pattern to the mould's recesses. Depending on the pattern to be imprinted as well as the imprint material, the process time of nanoimprint lithography might be quite large.

Solid-state embossing is another known method for forming a pattern on a substrate. It is a non-lithographic patterning technique that is often used for manufacturing diffraction gratings, compact discs, and security features such as holograms. Nanoscale patterns may be formed. The process consists of forcing a microcutting tool that is normally made from silicon and comprises an array of protruding wedges into a multilayer structure. In WO 02/29912 A1 solid-state embossing is employed for manufacturing electronic circuits. It can be used to "cut" transistor channels into a single conducting layer supported by a PET (polyethylene terephthalate) substrate. Channel lengths of down to 12 micrometers can be achieved. The method can also be employed for the manufacture of vertical-channel transistors. A vertical-channel transistor is defined such that the source and the drain electrodes are positioned on top of each other and the channel length is defined by the thickness of an insulating layer. As the thickness of the insulating layer can be well controlled even on a sub-micrometer length-scale, vertical architectures are highly relevant for short channel length transistors. In N. Stutzmann et al., Science 299, 1881 (2003) solid-state embossing is used for controlled microcutting of vertical sidewalls into a conductor-insulator-conductor trilayer structure. Vertical channel transistors with channel lengths of down to 0.7 micrometer can be generated. Solid-state embossing is usually quite time consuming and the employed microcutting tool has to be robust, especially for a large-scale production facility.

Another known method for forming and patterning high-resolution structures is so-called microcontact printing. Microcontact printing is based on the selective transfer of an organothiol or a silane to a substrate using an elastomeric stamp. The areas of the substrate that have been contacted by the raised surfaces of the elastomeric stamp are covered with a self-assembled monolayer of the organothiol or the silane and can be used as etch resist in a subsequent processing step. The resolution of the method is mainly determined by the resolution of the elastomeric stamp. The elastomeric stamps are usually fabricated from poly (dimethyl) siloxane (PDMS), polyimide, or phenolformaldehyde polymer. Microcontact printing is usually followed by either etching, electroless plating (e.g. U. Zschieschang et al., Advanced Materials 15, 1147 (2003)), or area-selective electropolymerisation (e.g. C. B. Groman et al., Chemical Materials 7, 526 (1995)) for forming electronic circuits. M. Leufgen et al., Applied Physics Letters 84, 1582 (2004) describes microcontact printing followed by etching for forming transistors with down to 100 nanometer channel length. WO 03/099463 A1 discloses a wave printing technique for automated patterning with microcontact printing. J. Schellekens et al., Materials Research Society Symposium Proceedings EXS-2. M2.9.1 (2004) describes transistors with down to 1 micrometer channel length, which have been microcontact wave printed onto 150 millimeter glass wavers. E. Kim et al., Applied Physics Letters 80, 4051 (2002) describes a method based on microcontact printing for direct patterning of a metal layer. A metal layer coated on a pre-patterned poly dimethyl siloxane stamp is transferred to a substrate by cold welding. When removing the stamp, the metal on the raised regions of the stamp adheres to the substrate and a metal pattern is formed. The inverse process where a stamp is used to lift-off a pattern from a homogenous metal layer is described in T. Wang et al., Advanced Materials 15, 1009 (2003). EP 0 953 420 A2 discloses so-called micromoulding in capillaries (MIMIC) for patterning polyaniline and carbon structures. A mould is put in conformal contact with a substrate, thereby forming microchannels. Capillary forces pull an ink solution into the channels. Solidification by evaporation of a solvent or thermal conversion followed by removal of the mould completes the fabrication of the microstructures. For micromoulding the electrode layout must fulfil tight requirements for the ink to actually flow by capillary forces. Because of the ink flow and the drying step micromoulding is a comparably slow process.

U.S. Pat. No. 6,946,332 B2 extends the microcontact printing concept to nanoscale dimensions in an additive process referred to as nanotransfer printing. In nanotransfer printing metal structures are directly transferred onto a substrate surface. Patterning of features with sizes approaching 100 nanometers and an edge resolution of less than 15 nanometers is achievable. WO 2004/004025 A2 discloses direct patterning of water-based conductive inks via a self-assembly process based on microcontact printing. A substrate is pre-patterned into hydrophobic and hydrophilic regions by microcontact printing of a hydrophobic self-assembled monolayer. When applying water-based ink, it spontaneously dewets from the hydrophobic regions, thereby forming material free channels.

Summarizingly, microcontact printing-based methods offer a resolution of down to below 100 nanometers. Microcontact wave printing allows for patterning of micron-sized features with an overlay accuracy of more than 2 micrometers over a 150 millimeter waver (M. M. J. Decré et al., Materials Research Society Symposium Proceedings EXS-2. M4.9.1. (2004)). The printing contact time for the 150 millimeter waver is reported to be 15 seconds which corresponds to a throughput of $10^{-3}$ m$^2$/s, not taking into account the stamp soaking and drying time.

Ink-jet printing is another known patterning method. Ink-jet printing is intrinsically a non-contact, additive technique. Sacrificial resist or lift-off layers are not required. Material is only deposited where it is actually needed. With ink-jet printing droplet volumes of down to 10 picoliters can be achieved which corresponds to a diameter of about 20 micrometers. Due to statistical variations of the flight direction of the droplets and the spreading on the substrate, the smallest features and gaps currently attainable with ink-jet printing are about 50 and 20 micrometers, respectively. Combining ink-jet printing with other patterning techniques that offer a resolution of below 10 micrometers, as taught for example in WO 01/46987 A2, may improve the method. Here the substrate is pre-patterned into hydrophobic and hydrophilic regions prior to the ink-jet deposition. The droplets are repelled by the hydrophobic regions and, hence, confined by their edges. The pre-patterning into hydrophilic and hydrophobic regions can be achieved by using self-assembled monolayers of a perfluorinated silane (WO 2005/038881 A2) or by a direct-write process based on laser patterning (WO 02/095805 A2). WO 03/056641 A1 discloses furthermore a lithography-free self-aligned ink-jet printing process, wherein a first conductive pattern is ink-jet printed onto a substrate, the surface of the first conductive pattern is selectively modified to be of low surface energy by using CF$_4$ plasma or by adding a suitable surfactant to the ink while not modifying the surface of the substrate, and a second conductive pattern that partially overlaps the first conductive pattern is ink-jet printed, not requiring precise relative alignment. The droplets of the second conductive pattern are repelled by and flow off the low energy surface of the first pattern and dry with their contact line in close proximity to the edges of the first pattern, thereby forming a small self-aligned gap. Transistors with less than 100 nanometer channels may be obtained.

U.S. Pat. No. 3,134,516 discloses the use of ink-jet printed hot-melt wax as etch resist that solidifies on contact with the substrate. Spreading of the printed droplets can thus be prevented. Ink-jet printed transistors with 30 to 50 micrometer channel length can be realized.

Ink-jet printing is intrinsically a serial process. Its throughput is nowadays limited to about 0.01 m$^2$/s.

Thermal imaging can also be used for forming patterns on a substrate, see for example U.S. Pat. No. 5,523,192 A, WO 02/070271 A2, or WO 2004/087434 A1. Thermal imaging is a dry, solvent-free digital printing process in which functional materials are transfer printed, layer by layer, from donor sheets onto a substrate using localized laser-induced heating. With a method based on thermal imaging transistors with down to 5 micrometer channel length can be produced. A resolution of less than 10 micrometers has been achieved over areas of more than 3 m$^2$. The materials, however, have to withstand high temperatures. Thermal imaging is intrinsically a serial process and its throughput is currently limited to about 0.002 m$^2$/s.

DISCLOSURE OF THE INVENTION

It is an object of the invention to provide a method for forming a pattern on a substrate that overcomes the drawbacks of the known methods discussed above. The method should be suitable for employment in the fields of large-area and/or low-cost electronics. The field of large-area electronics, also macro-electronics, relates to devices with electronic functionality distributed over large areas. A backplane for a large flat panel display, which requires a switching transistor behind each pixel, constitutes a typical example. The field of low-cost electronics relates to application areas and electronic devices for which silicon technology is prohibitive due to cost reasons, an example being an item level RFID (radio-frequency identification) tag that can be used as electronic barcode. Large-area and/or low-cost electronics require large-area compatible and/or low-cost materials such as hydrogenated amorphous silicon or organic semiconductors. Furthermore, methods for forming a pattern on a substrate are required that offer the necessary resolution, registration accuracy, robustness, cost-effectiveness and, in particular, throughput to be viable for large-area and/or low-cost electronic components.

It is a further object of the invention to provide an electronic device, in particular an organic electronic device, with one or more gaps between conducting areas/layers, the size of the one or more gaps being below 10 μm, in particular in below 5 μm, preferred below 3 μm and especially preferred in the submicron range. Such an electronic device shall, for example, be an organic photo diode (oPD) with maximised useable photoactive area or an organic field effect transistor (oFET) with submicron sized channels/gaps or an organic solar cell with pixel structure and high fill factor at the same time.

In order to implement these and still further objects of the invention, which will become more readily apparent as the description proceeds, a method for forming a pattern on a substrate with an upper surface and a lower surface is provided, which comprises the steps of depositing a first layer on one or more parts of the upper surface of the substrate wherein the material of the first layer is opaque, depositing a photosensitive layer such that part of the photosensitive layer covers at least part of the first layer, exposing the photosensitive layer to a light beam, the light beam impinging on the lower surface of the substrate under an oblique angle of incidence, removing the exposed regions of the photosensitive layer, depositing a second layer such that part of the second layer covers a remaining region of the photosensitive layer, and removing at least a part of the remaining region of the photosensitive layer. The first layer is not deposited on the entire upper surface of the substrate. Hence, openings remain. The second layer has a thickness that allows its lifting off when removing at least a part of the remaining region of the photosensitive layer. The photosensitive layer is preferably deposited directly on the at least one part of the first layer.

The oblique exposure by the light beam and the removal of the exposed regions of the photosensitive layer lead to an overhang of the photosensitive layer over an edge of the first layer which is later on, among others, covered by the second layer. Removal of the overhang then leads also to the removal of that particular part of the second layer that covers the overhang. In the last step of the method according to the invention the remaining region of the photosensitive layer is preferably entirely removed by dissolution. The terms "upper" and "lower" relate to the depictions on the figure sheets.

According to another aspect of the method according to the invention after exposition of the photosensitive layer to a light beam and removal of the exposed region of the photosensitive layer anisotropic plasma etching may be applied from above the upper surface of the substrate. Due to the overhang of the photosensitive layer a narrow stripe along the edge of the first layer is not exposed to the plasma and conserves its surface condition, whereas the surface properties of the regions of the first layer that are not covered by the first layer and the photosensitive layer nor shadowed by the overhang can be changed by the impact of the plasma. Then a second layer is deposited from above. As the surface properties of the first layer are different for different regions due to the anisotropic plasma etching, the second layer preferentially finally remains on those regions to which anisotropic plasma etching has been applied.

The used substrate is at least partially transparent to the light beam, for which preferably UV-radiation is employed. The first layer of opaque material is non-transparent with respect to the light beam, in particular with respect to UV-radiation. As photosensitive layer a photosensitive polymer, in particular a positive photosensitive resist may be employed. The material of the second layer does not have to be but may be opaque.

With the method according to the invention patterns can be formed on a substrate, the patterns comprising parallel structures separated by parallely aligned gaps, advantageously by gaps in the submicron range. The size of the gaps is determined basically by two parameters, namely by the thickness of the applied photosensitive layer (also called photo resist layer) and by the angle of incidence of the light beam impinging on the lower surface of the substrate. For generating the light beam preferably a light source (in particular an UV light source) is used that generates parallel light/light beams. With the method according to the invention a resolution of down to sub-micrometer range can be achieved. The method according to the invention is simple and robust and is applicable in a high-throughput roll-to-roll fabrication process. Its basic principle is mask-free photolithography.

The method according to the invention is a self-alignment method. The term "self-alignment" refers to the use of a pre-existing structure or pattern for the definition of a pattern in a subsequent processing step. Self-alignment methods are, for example, used in CMOS technology, where the gate electrode serves as mask during the ion implantation for forming the source and drain electrodes, hereby reducing the gate-to-source/drain stray capacitance to a minimum. M. Ando et al., Applied Physics Letters 85, 1849 (2004) uses the gate electrode as photolithographic mask to pattern a self-assembled monolayer via back-substrate exposure. WO 2004/077500 A2 discloses a one-mask photolithographic process wherein the gate electrode is used to define a gap between source and drain electrodes of a field effect transistor by back-substrate exposure of a photosensitive layer. The known self-alignment methods relate to the self-aligned formation of two different levels in a multilayer system. In contrast, the method according to the invention makes use of self-alignment for forming a pattern on one level of a stack or multilayer system, the pattern for example consisting of sub-micron sized gaps.

The method according of the invention can be used to fabricate an electronic device, for example an organic photo diode (oPD). An organic photo diode (oPD) formed by the method according to the invention is characterized by an enhanced fill factor. The fill factor is defined by the ratio of the size of the contact area/conducting layers (so-called contact size) and the space separating laterally contact areas/conducting layers. A submicron gap can advantageously be realized between the conductive layers by reproducing one edge in order to create a parallely aligned pattern that merges with the adjacent conductive layer. The larger the contact size the higher is the sensitivity and the signal-to-noise ratio of the organic photo diode. As an organic photo diode with a high fill factor can be fabricated with the method according to the invention, which is compatible with a roll-to-roll fabrication process, an organic photo diode can be fabricated in a roll-to-roll fabrication process.

Furthermore, the method according to the invention can be used e.g. to fabricate an organic field-effect transistor (oFET) which in particular comprises parallely aligned source and drain electrodes, which are separated by a gap, the gap preferably being in the submicron range. Advantageously, no photo masks are needed for photolithography. As the method according to the invention is robust and can be implemented into a high throughput process, an organic field-effect transistor can be fabricated by the method according to the invention in a high throughput process, e.g. a roll-to-roll fabrication process.

For the method according to the invention no expensive equipment or manufacturing tools are required. The method allows for a highly parallel fabrication process and is compatible with large-area processing. The area that can be processed in parallel at a given time is only limited by the size of the light beam. The method is also compatible with a continuous roll-to-roll fabrication process. The method is contact-less and hence robust against surface defects. It offers a high resolution, which is particularly important for logic and sensor applications where often high switching speeds are required.

Apart from electronic applications the method according to the invention can be used in any fabrication process where high-resolution features or patterns must be produced over large areas and with a high throughput. Examples of such additional application areas include optical components such as filters, polarizers, gratings, diffractive lenses and waveguides, and micro systems such as microelectromechanical system (MEMS) sensors, MEMS actuators and microfluidic channels.

BRIEF DESCRIPTION OF THE DRAWINGS

Further advantageous features and applications of the invention can be found in the dependent claims as well as in the following description of the drawings illustrating the invention. In the drawings like reference signs designate the same or similar parts throughout the several figures of which:

MODES FOR CARRYING OUT THE INVENTION

Figure 1:
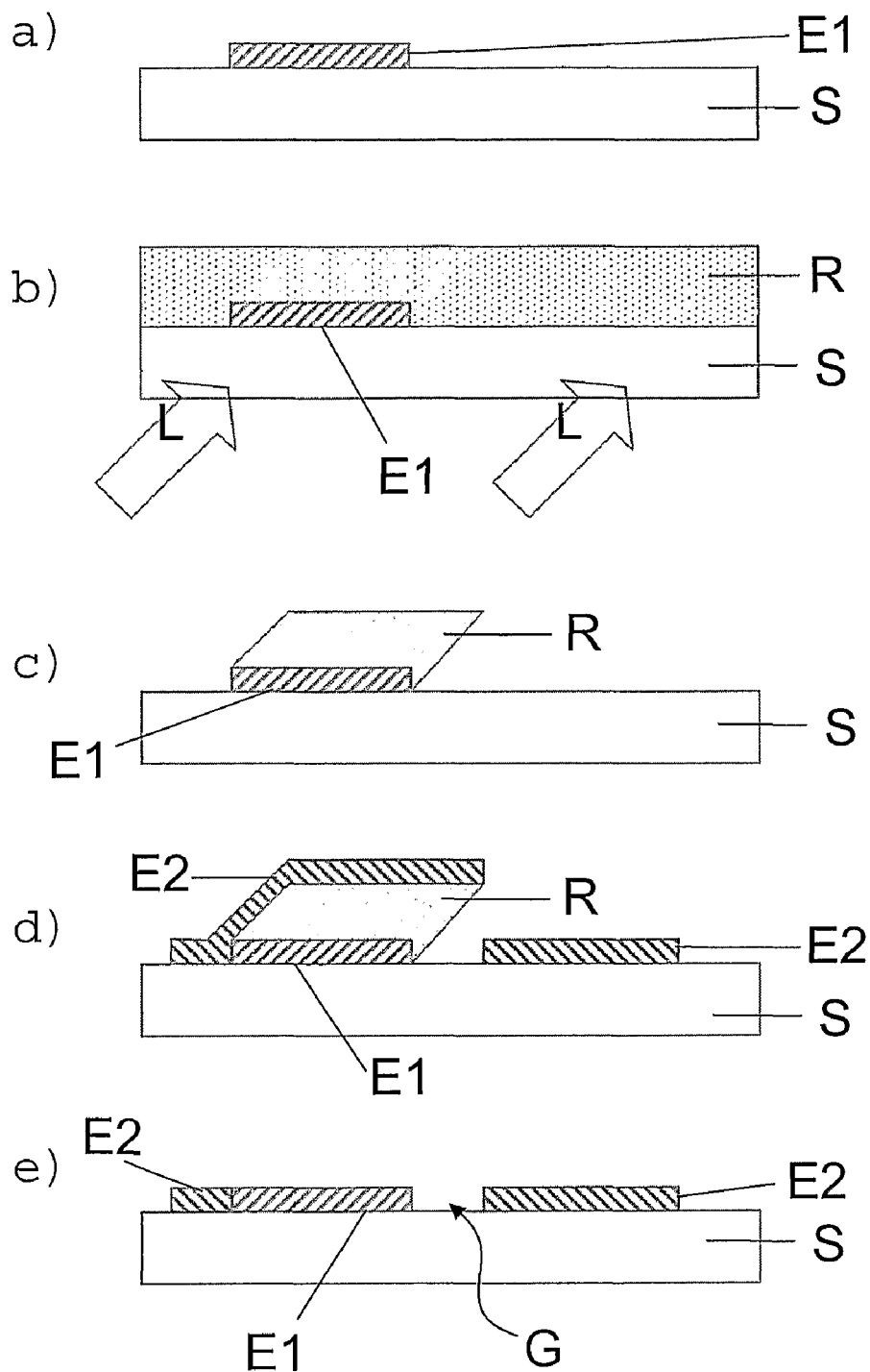
FIG. 1 shows a schematic representation of the steps for forming a pattern on a substrate in a sectional view according to the method of the invention.
Figure 2:
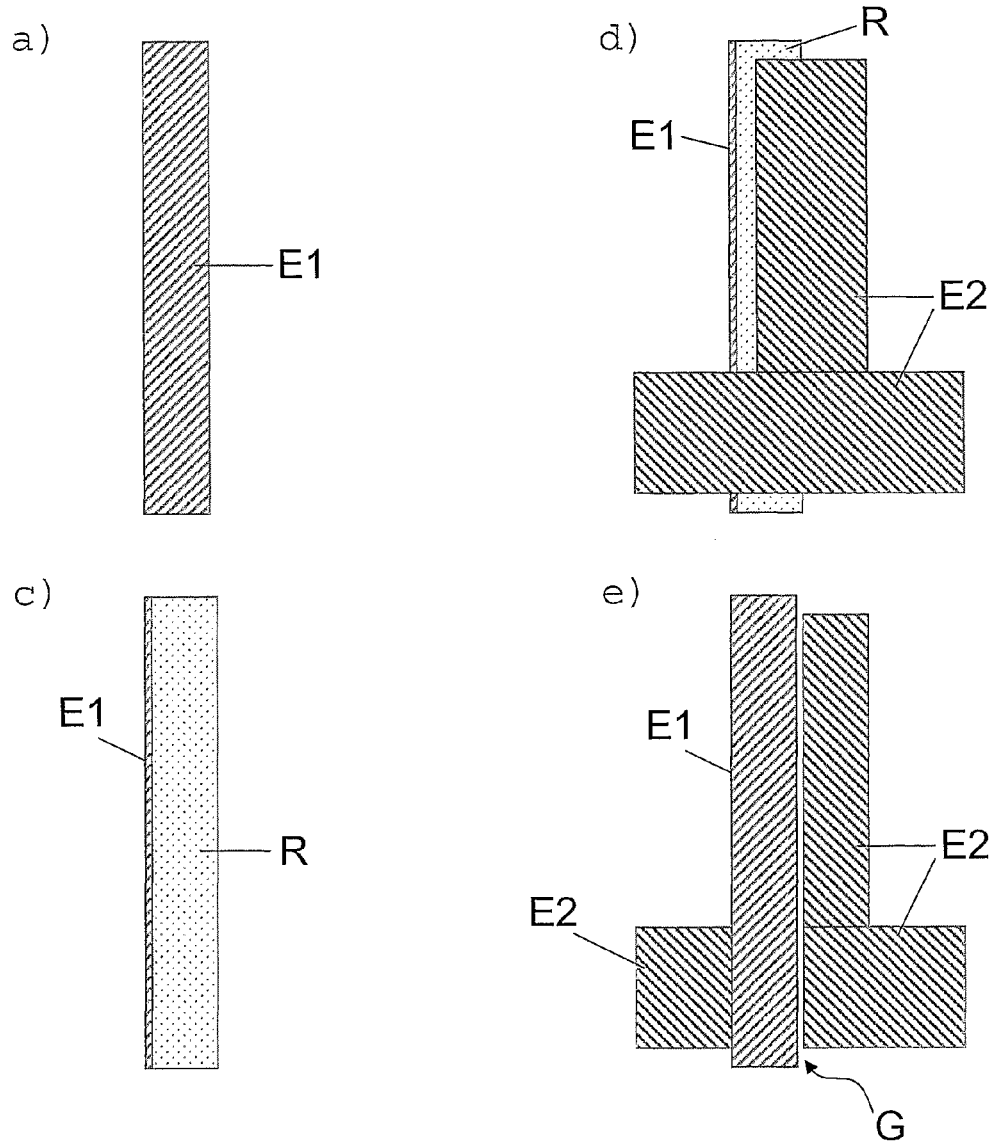
FIG. 2 shows the schematic representation of FIG. 1 in top view.

FIGS. 1 and 2 show schematic representations of the method according to the invention. In a first step (FIGS. 1a and 2a) the first layer E1 of an opaque material is deposited on the upper surface of a substrate S. The substrate S is at least partially transparent, in particular semi-transparent, to a light beam L, the light beam preferably comprising or consisting of UV-radiation which is later on needed to expose a photosensitive layer R. The first layer E1 is non-transparent to the light beam L, in particular to UV-radiation. The material of the first layer E1 can for example be an electrical conductor, the first layer E1 then forming an electrode. Suitable patterning techniques such as, for example, so called shadow mask evaporation can be employed for forming the first layer E1 into its desired shape. Preferably additive patterning techniques, which are compatible with roll-to-roll fabrication such as patterning techniques including gravure and ink-jet printing, are employed for forming the first layer E1.

In a next step a photosensitive layer R, which can be, for example, a positive photosensitive polymer or resist, is applied (FIG. 1b), the photosensitive layer R preferable being of a homogeneous and thin type. The photosensitive layer R is sensitive to the light beam L, in particular to UV-radiation. For applying the photosensitive layer R deposition methods are preferred which are compatible to roll-to-roll fabrication such as so-called roller coating and screen printing methods, for example. The thickness of the photosensitive layer ranges preferentially from a few 100 nanometers to a few micrometers. After deposition and drying, the photosensitive layer R is exposed to a light beam L, particularly comprising UV-radiation, through the substrate S, whereby the light beam L impinges on the lower surface of the substrate S under an oblique angle of incidence. Hence, the exposure to the light beam L takes place under a certain angle between the substrate's surface normal and the light beam L. The first, opaque layer E1 shadows or shields, respectively, the light beam L as schematically depicted in FIG. 1b. After exposure, the photosensitive layer R is immersed in developer, which removes the exposed region of the photosensitive layer R. The oblique or off-normal exposure leads to an overhang of the photosensitive layer R over an edge of the first layer E1, the edge being opposed to the position of the light source with respect to the centre of the first layer E1 (FIGS. 1c and 2c).

Then, a second layer E2 is deposited such that part of the second layer E2 covers the remaining region of the photosensitive layer R (FIGS. 1d and 2d). The material of the second layer E2 can be an electrical conductor such that the second layer E2 constitutes an electrode. A thin film is preferably used as second layer E2. The same patterning techniques as described above for depositing the first layer E1 can be used for depositing the second layer E2. The second layer E2 can, for example, be deposited by physical vapour deposition (PVD).

Subsequently, the remaining region of the photosensitive layer R is removed in particular by dissolution in an appropriate solvent, thereby lifting off the second layer E2 in those areas where it covered the remaining region of the photosensitive layer R (FIGS. 1e and 2e). The removal of the remaining region of the photosensitive layer R covered by the second layer E2 results in the small gap G between the first layer E1 and the second layer E2, both layers E1 and E2 being positioned on the substrate S. The length of the gap G is defined as the distance between the adjacent edges of the first and the second layer E1, E2.

Figure 3:
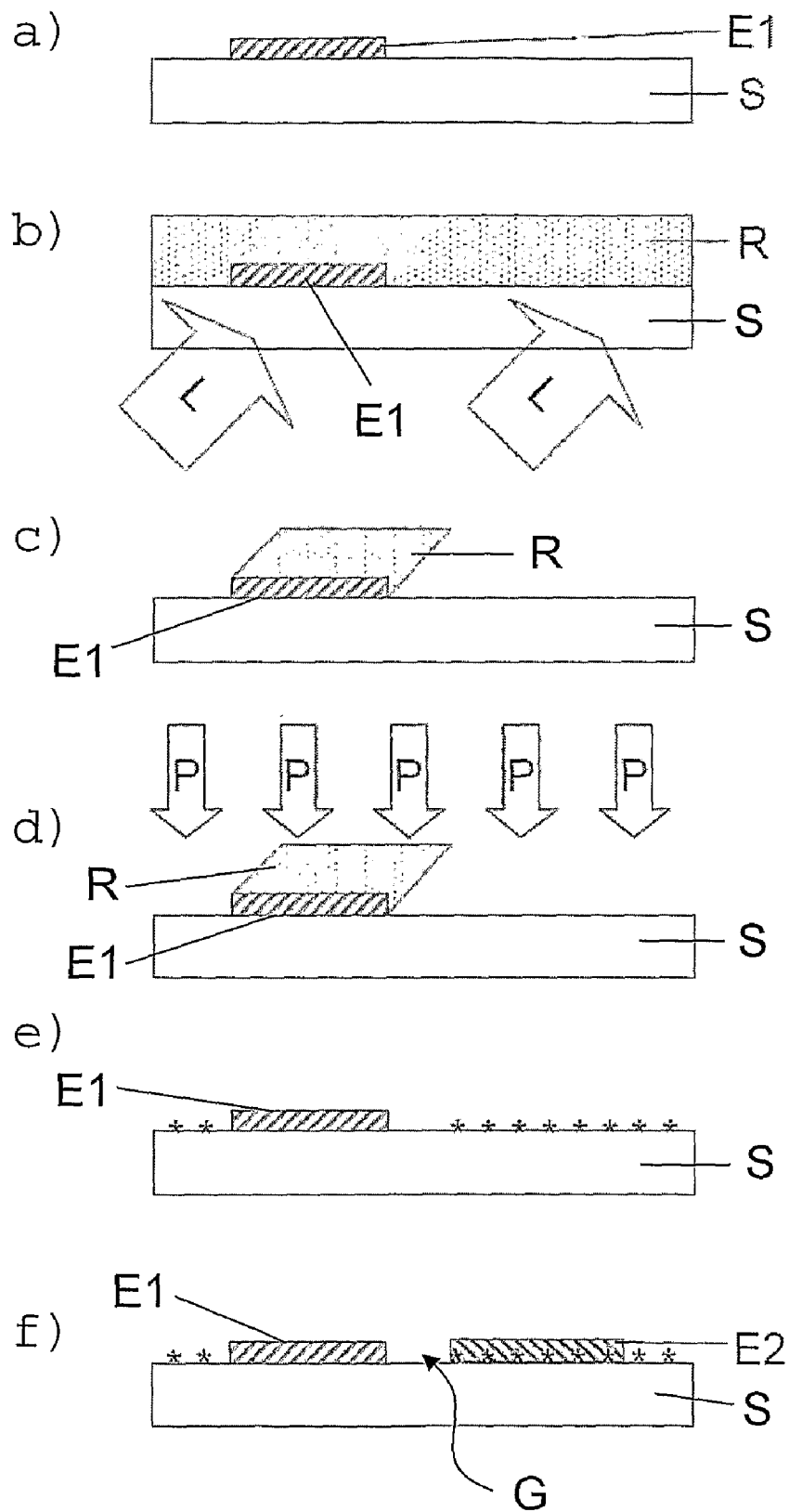
FIG. 3 shows a schematic representation of the steps for forming a pattern on a substrate in a sectional view according to another aspect of the method of the invention.

The method according to the invention may be altered as shown in FIG. 3 in that after the photosensitive layer R has been exposed to the light beam L and the exposed region of the photosensitive layer R has been removed as described above, anisotropic plasma etching is applied. FIGS. 3a, 3b and 3c correspond to FIGS. 1a, 1b and 1c and it is referred to the above description thereof. Then a plasma P is applied as etchant from above the upper surface of the substrate S (FIG. 3d) in an anisotropic etching step. Due to the overhang of the photosensitive layer R a narrow stripe along the edge of the first layer E1 is not exposed to the plasma P and its surface condition is conserved, whereas the surface condition of the regions not shadowed by the overhang might be drastically changed by the impact of the plasma P. In FIG. 3e the stars (*) on the upper surface of the substrate S indicate those regions whose surface conditions have changed due to the anisotropic plasma etching. Subsequently, a second layer E2 is deposited, for example by ink-jet printing, which preferentially finally remains on those regions of the substrate S whose surface condition has been altered due to the application of anisotropic plasma etching (FIG. 3f).

For example, an initially hydrophobic (hydrophilic) upper surface of a substrate S can be rendered hydrophilic (hydrophobic) by the application of an appropriate plasma P in an anisotropic plasma etching step. After the photosensitive layer R has been removed and anisotropic plasma etching has been applied to the upper surface of the substrate S, the substrate regions not covered by the first layer E1 are hydrophilic (hydrophobic) except for a narrow stripe along the edge of the first layer E1 which is still hydrophobic (hydrophilic) leading to a high-resolution surface energy pattern being created. This high-resolution surface energy pattern can now be transferred into high-resolution structures, for instance by using conventional print processes as for instance taught in US 2003/0059987 A1. For example, ink-jet printing can be used to deposit a second layer E2. Whereas ink-jet printing is usually limited to rather coarse feature sizes of a few 10 micrometers, with the high-resolution surface energy pattern created as described above this limitation may be overcome: After deposition of the second layer E2 by ink-jet printing, the ink of the second layer E2 spreads on the hydrophilic (hydrophobic) part of the upper surface of the substrate S, but is repelled by the narrow hydrophobic (hydrophilic) stripe at the edge of the first layer E1. The repulsion of the ink leads to a narrow gap G between the first and the second layer E1, E2 (confer FIG. 3f). The size of the gap G can be much smaller than would be the case if the second layer would be ink-jet printed on a substrate S without surface energy pattern, in particular on a substrate S to whose surface no anisotropic plasma etching has been previously applied.

Since the critical feature or pattern size is defined by the method according to the invention, which is a self-alignment method, the smallest achievable feature size can be much lower than the feature size achievable with the patterning techniques used for depositing the first and the second layers E1 and E2 (confer FIG. 1, 2 or 3). With a method according to the invention patterns, in particular material-free gaps, with down to submicrometer length can be formed in thin films of opaque materials. The method according to the invention comprises a contact-less mask-free photolithographic step for defining the small features or gaps, respectively, of the achievable pattern. The method of the invention is especially suited for producing submicrometer patterns or structures in a simple and cost-effective way as it does not require costly equipment.

Figure 4:
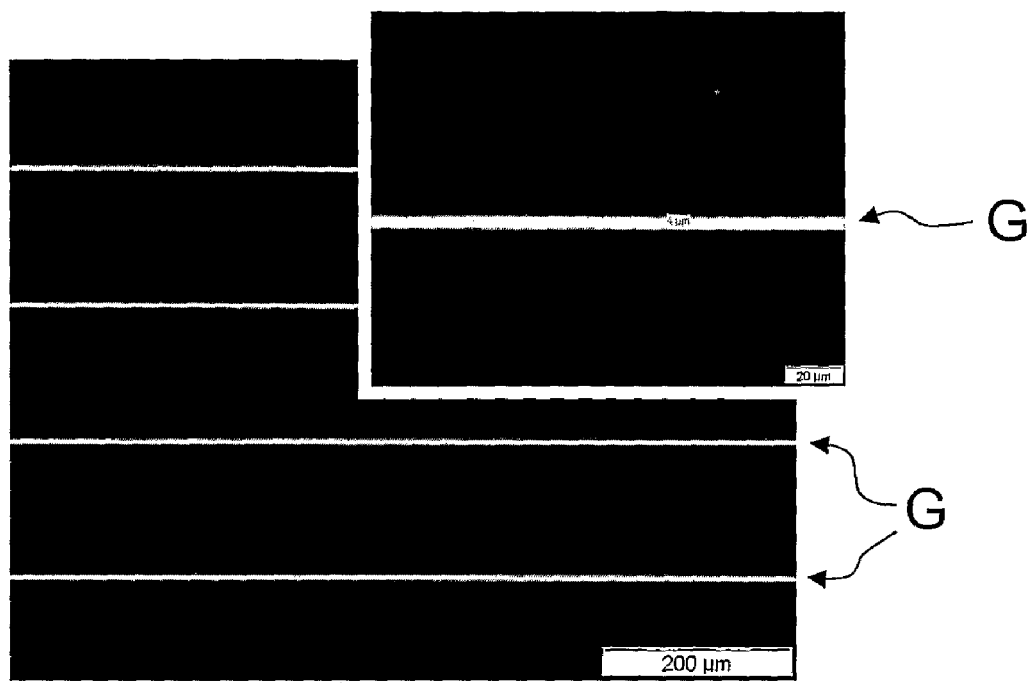
FIG. 4 shows transmission light microscopy images of channels formed with a method of the invention.
Figure 4:
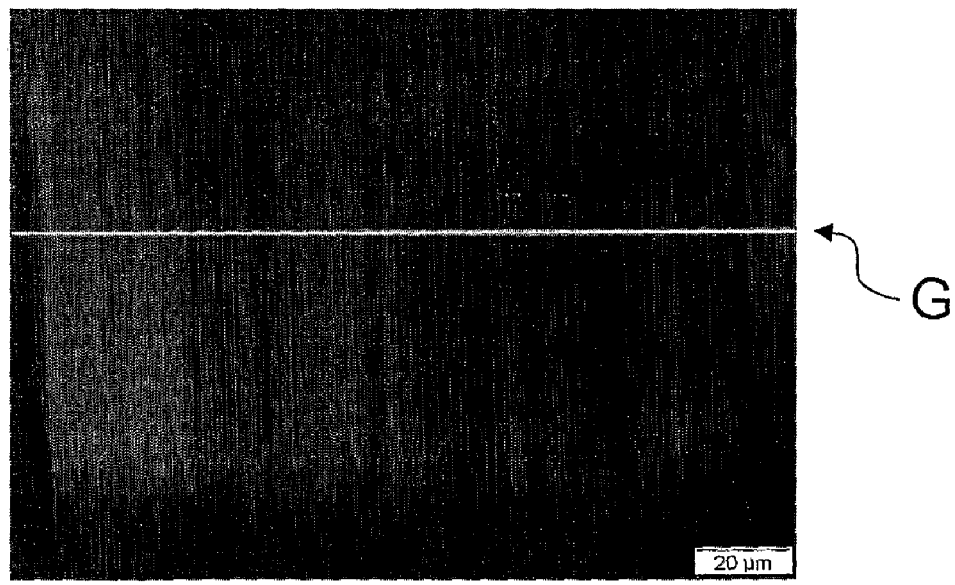

FIG. 4 shows transmission light microscopy images of channels G fabricated with the method according to the invention. FIG. 4a shows four micrometer wide channels G, wherein the overlapping figure is an enlargement of a part of the underlying figure. FIG. 4b shows a 400 nm wide channel G.

Figure 5:
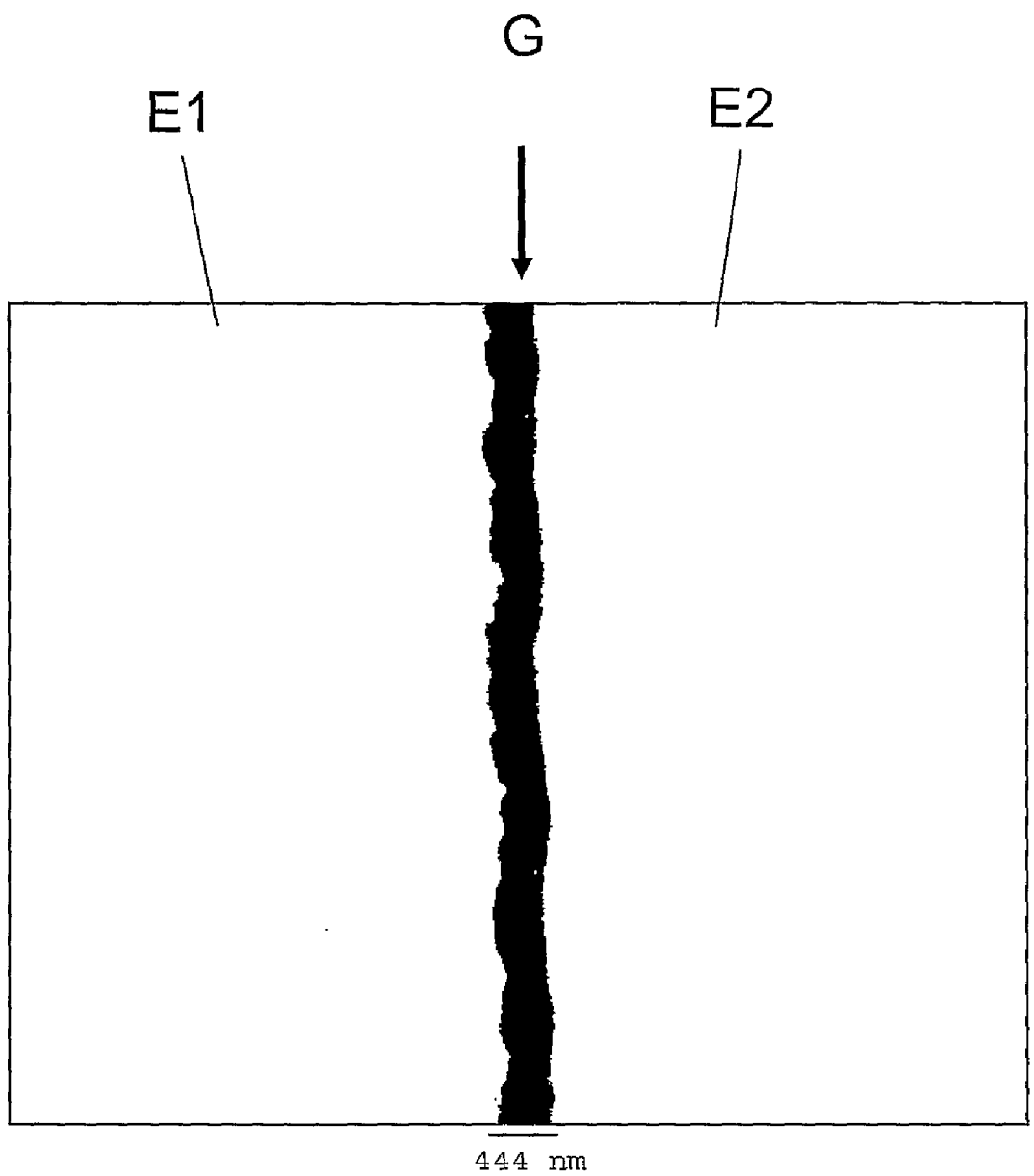
FIG. 5 shows a scanning electron microscope image of a channel formed by the method of the invention.

FIG. 5 shows a scanning electron microscope image of an approximately 400 nm wide channel G fabricated with the method according to the invention. The first and the second layer, E1 and E2, are realized by gold electrodes. The channels shown in FIGS. 4 and 5 are metal-free. It can be seen that submicrometer wide channels can be easily obtained by employing the method according to the invention.

Figure 6:
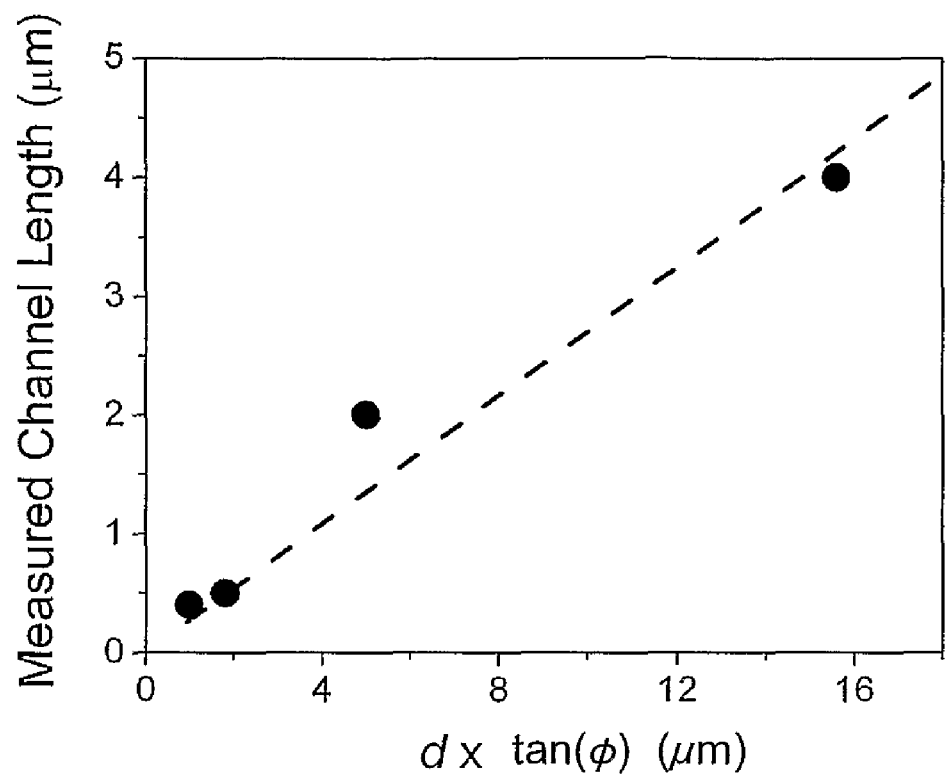
FIG. 6 shows a diagram depicting the measured channel length as a function of the thickness of the photosensitive layer and the angle of incidence of the light beam.

The length of the gap G between the first layer E1 and the second layer E2 depends on and can be controlled by the thickness d of the photosensitive layer R and the oblique angle $\phi$ of incidence of the light beam L, wherein the length of the gap G is defined as the distance between the adjacent edges of the first and the second layer E1, E2. FIG. 6 shows a diagram depicting the measured channel length, i.e. the length of the gap G, in micrometers depending on the photosensitive layer thickness d and the angle $\phi$ of incidence, the product of the thickness d and the tangent of the angle $\phi$ of incidence given in micrometers. As can be seen, the length of the gap G increases monotonically with increasing photosensitive layer thickness d and is increasing angle $\phi$ of incidence, whereby the angle $\phi$ of incidence is measured between the substrate surface normal and the direction of the light beam L.

Figure 7:
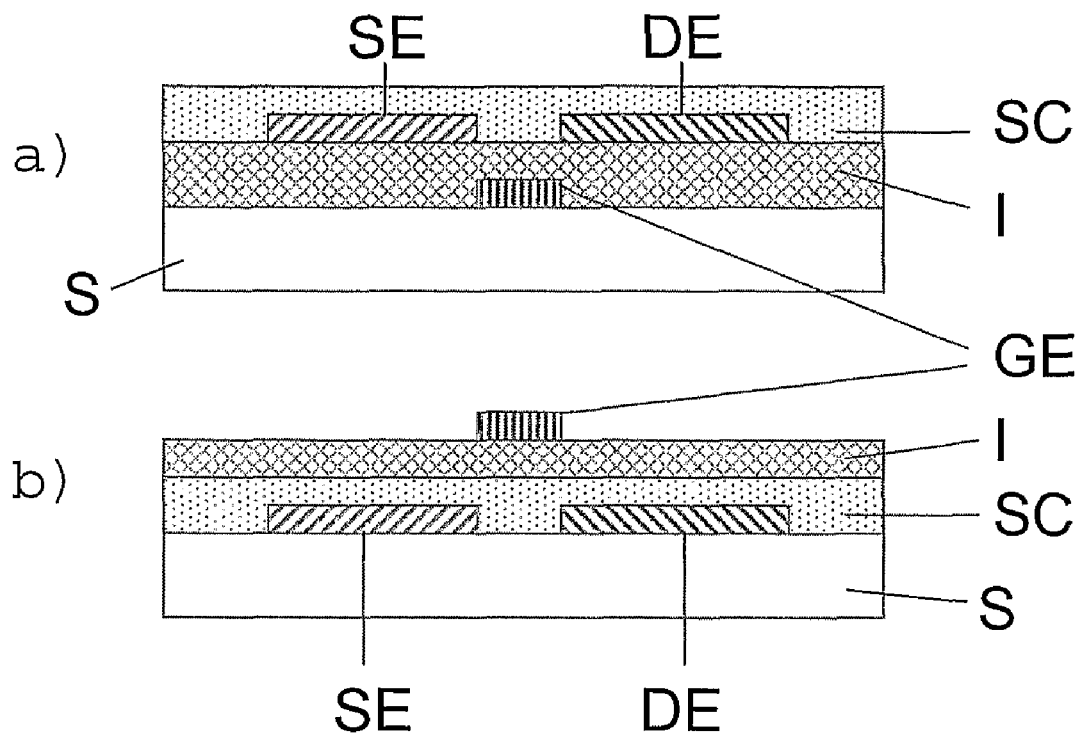
FIG. 7 shows schematic diagrams of a bottom-gate thin-film field effect transistor (FIG. 7a) and a top-gate thin-film field effect transistor (FIG. 7b)

The method according to the invention (confer FIGS. 1 to 3) can be used to form electronic components, in particular organic electronic components, such as a thin-film field effect transistor with small source-drain separation. The method according to the invention can especially be used to define source and drain electrodes of a thin-film field effect transistor (TFT). A thin-film field effect transistor consists typically of a substrate S, a gate electrode GE, an insulator layer I, a semiconductor layer SC, and source and drain electrodes SE, DE (confer FIG. 7). For a bottom-gate thin-film field effect transistor as depicted in FIG. 7a a gate electrode GE is first formed on a substrate S. Then an insulator layer I is deposited. The source and drain electrodes SE, DE are subsequently formed on the insulator layer I by using the method according to the invention (confer FIGS. 1 to 3 and description thereof), wherein either the source electrode SE represents the first layer E1 and the drain electrode DE represents the second layer E2 or vice versa (confer FIG. 1, 2 or 3). Then the semiconductor layer SC is deposited.

For a top-gate thin-film field effect transistor as depicted in FIG. 7b source and drain electrodes SE, DE are first formed on a substrate S by applying the method according to the invention (confer FIGS. 1 to 3 and description thereof), wherein either the source electrode SE represents the first layer E1 and the drain electrode DE represents the second layer E2 or vice versa (confer FIG. 1, 2 or 3). Then a semiconductor layer SC is deposited followed by the deposition of an insulator layer I on the semiconductor layer SC. Finally, the gate electrode GE is formed on the insulator layer I.

Figure 8:
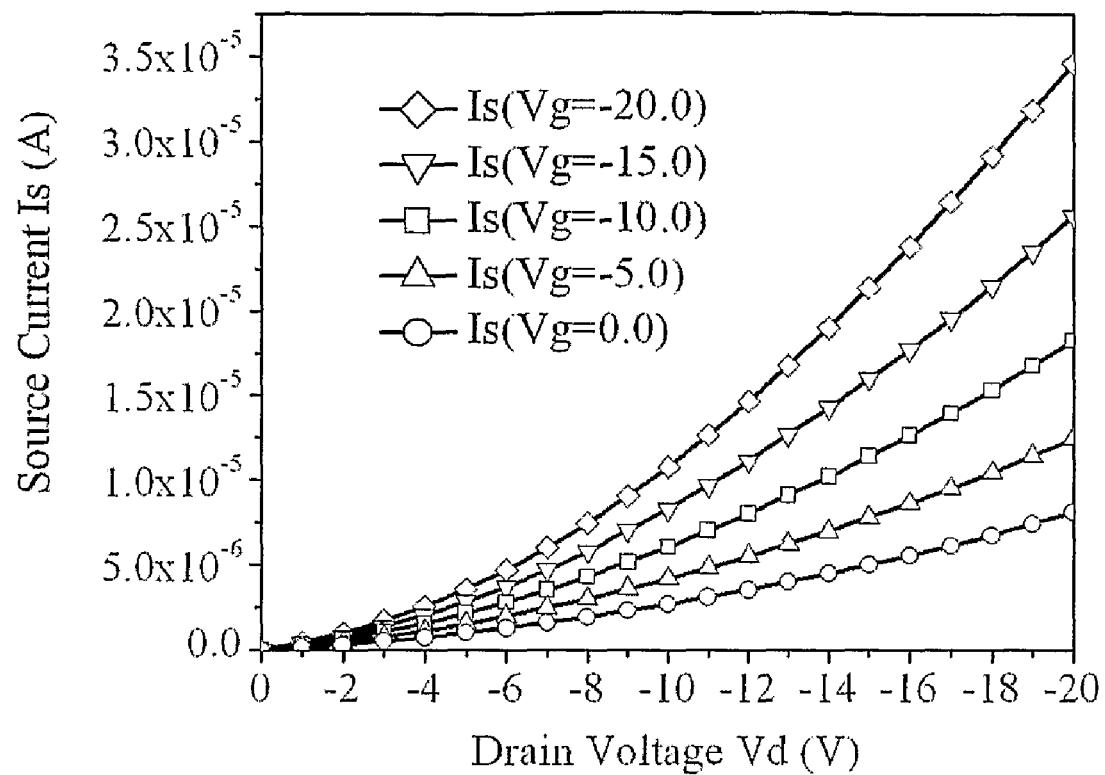
FIG. 8 shows a diagram depicting the electrical characteristics of a polymer field effect transistor fabricated by using the method of the invention.

FIG. 8 shows a diagram depicting the electrical characteristics of a bottom-gate polymer thin-film field effect transistor fabricated with the method according to the invention. Depicted is the source current Is in Ampere on the ordinate and the drain voltage Vd in Volts on the axis of abscissae for different gate voltages Vg given in Volts. A transparent indium-tin-oxide (ITO) strip formed on a glass substrate serves as gate electrode. As an insulator layer a 300 nanometer cross-linkable poly(4-vinylphenol) layer is spin-cast from solution and subsequently cross-linked by annealing at 200 degrees Celsius. On the insulator layer a gold-source electrode corresponding to the first layer E1 (confer FIG. 1, 2 or 3) is patterned. Then a 1000 nanometer thick photosensitive layer of photo resist (Shipley S1805) is spin-cast. Subsequently the glass substrate is exposed to UV-radiation from its lower side under an angle of incidence of 45 degrees. A thin second layer corresponding to the second layer E2 in FIG. 1, 2 or 3 of gold is then deposited and patterned by shadow-mask evaporation. After that a transistor channel is formed by dissolving the photosensitive layer in acetone, thereby partially lifting off the gold film representing the second layer E2. Finally, a thin layer of the semiconductor poly(3-hexylthiophene) is spin-cast on top forming the semiconductor layer. The resulting channel length, that is source-to-drain separation, is 400 nanometers, the channel width is 2 millimeters and the capacitance of the 300 nanometer thick polymer insulator layer is 10 nF/cm$^2$. As can be seen in FIG. 8, the source current increases super-linearly with increasing drain voltage. The source current actually represents the source-to-drain current and can be controlled by a gate voltage. Saturation does not occur as the ratio between the channel length and the insulator layer thickness is small, i.e. about 1.3. Ideal MOSFET behaviour can be observed if this ratio exceeds 5. From the curves of FIG. 8 the field effect mobility can be estimated to be a few times $10^{-3}$ cm$^2$/Vs, a value which is typical for poly(3-hexylthiophene) in combination with a poly(4-venyl-phenol) dielectric.

The method according to the invention is suitable for producing organic electronic devices with submicron sized gaps between organic areas on a surface of a substrate for large-area and/or low-cost electronics. In particular, material-free gaps down to submicrometer lengths can be formed by the method according to the invention in thin films of opaque materials (confer FIG. 6). The characteristic features of devices that can be formed by the method according to the invention are as follows: These devices comprise a substrate, which is transparent to a certain spectral range, in particular to UV light, and a first preferably conductive layer, wherein the first layer is located on one side of the substrate. The first layer does not cover the entire substrate. The material of the substrate can comprise glass, in particular quartz glass, and/or polymer foil such as PET (polyethylene terephthalate), PEN (polyethylene naphthalate), PC (polycarbonate), PMMA (polymethyl methacrylate) or similar. The transparent substrate can be coated on the other side, i.e. its lower surface, by an opaque material after the method according to the invention (i.e. its application) is finished.

The first conductive layer is preferentially patterned with low resolution, i.e. with a resolution larger than 10 μm, in particular larger than 50 μm. The first layer is at least opaque for that particular spectral range for which the substrate is transparent. Preferentially, the first layer is opaque in the UV spectral range. Preferably, the transmission through the first layer in the desired spectral range is below 10%, even more preferably below 1%. Suitable materials for the first conductive layer comprise e.g. Aluminium (Al), Gold (Au), Platinum (Pt), Nickel (Ni) and/or Nichrome (NiCr) alloys and/or conducting polymers such as PEDOT:PSS (Poly(3,4-ethylenedioxythiophene) poly(styrenesulfonate)) and/or organic conductors such as TCNQ-TTF (tetracyanoquinodimethane-tetrathiafulvalene).

The devices formed by the method according to the invention further comprise a second, preferably conductive, layer on the same surface of the substrate as the first, preferably conductive, layer. Areas covered by the first conductive layer are separated from areas covered by the second conductive layer on at least one side by a gap with a size below 10 μm, in particular below 5 μm, preferred below 3 μm and especially preferred in the submicron range. The preferably submicron sized gaps are aligned in their longitudinal direction in parallel in the plane spanned by the surface of the substrate (confer FIG. 4a). The gaps are preferentially electrically isolating.

Possible materials for the second conductive layer are the same materials as for the first conductive layer. They can also be transparent conducting oxides such as ITO (indium tin oxide). The second conductive layer may be transparent, even in the UV spectral range.

With the method according to the invention e.g. organic electronic devices such as oFETs (organic field effect transistors) with consecutive parallel and sub-micrometer wide spaced electrodes (formed by the conductive layers) and oPDs (organic photo diodes) with a very high fill factor can be formed.

An organic photo diode (oPD) formed by the method according to the invention as electronic device is characterized by an enhanced fill factor. The fill factor is defined by the ratio of the size of the contact area/conduction layers (so-called contact size) and the space separating laterally contact areas/conduction layers. A submicron gap can advantageously be realized between the conductive layers by reproducing one edge in order to create a parallel aligned pattern that merges with the adjacent conductive layer. The larger the contact size the higher is the sensitivity and the signal-to-noise ratio of the organic photo diode.

At the moment neither state of the art evaporation nor state of the art printing methods provide sufficient lateral resolution to achieve reproducible submicron gaps/separation between the contacts/conductive layers of organic photo diodes which are manufactured by way of a high throughput process. By the method according to the invention the ridge/edge of the first layer is reproduced parallel to the original/first one by contactless lithography.

An organic photodiode (oPD) with a high fill factor that comprises structured electrodes/conductors formed by conductive layers can be fabricated by the method according to the invention on a substrate, which is transparent in particular in the near UV domain. The method for forming the corresponding pattern on the substance comprises the steps of depositing a first conductive layer that is opaque at least for UV light, depositing a photosensitive layer such that it covers at least the ridges/edges of the first layer and the openings of the first layer, i.e. the openings being those parts of the substrate not covered by the first layer, exposing the photosensitive layer to a light beam (in particular an UV light beam), the light beam impinging on the lower surface of the substrate under an oblique angle of incidence, removing the exposed regions of the photosensitive layer thereby leaving behind an overhang over specific ridges/edges of the first layer, depositing a second conductive layer that covers at least the left behind parts of the photosensitive layer, removing the left behind parts of the photosensitive layer, thereby leaving a precise gap defined by the ridge/edges of the first layer and the second layer, the second layer representing a reproduction of the first layer.

Figure 9:
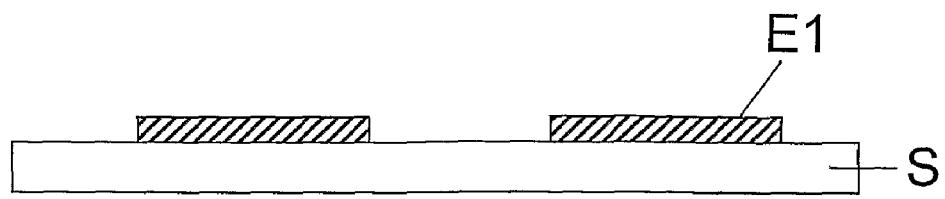
FIG. 9 shows a schematic representation of the fabrication of an organic photo diode in a sectional view according to the method of the invention.
Figure 9:
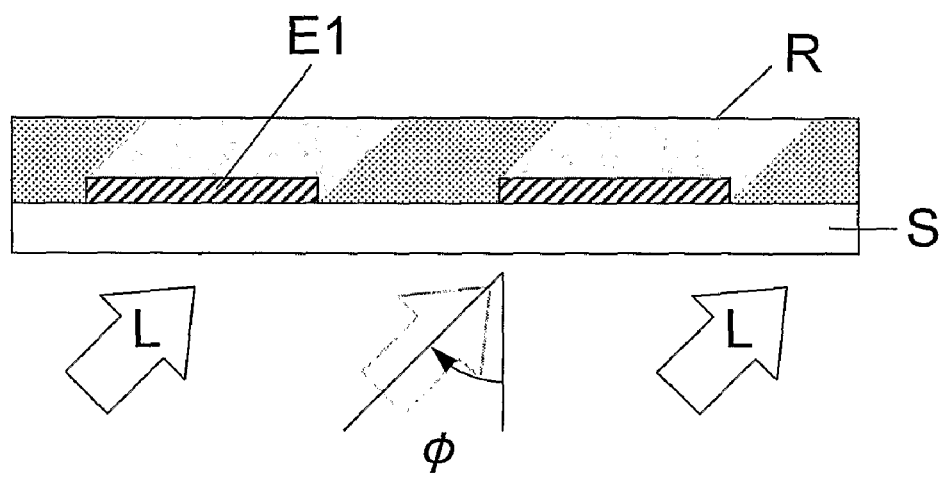
Figure 9:
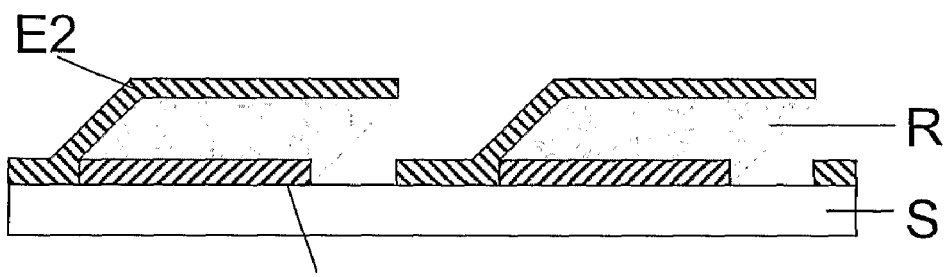
Figure 9:
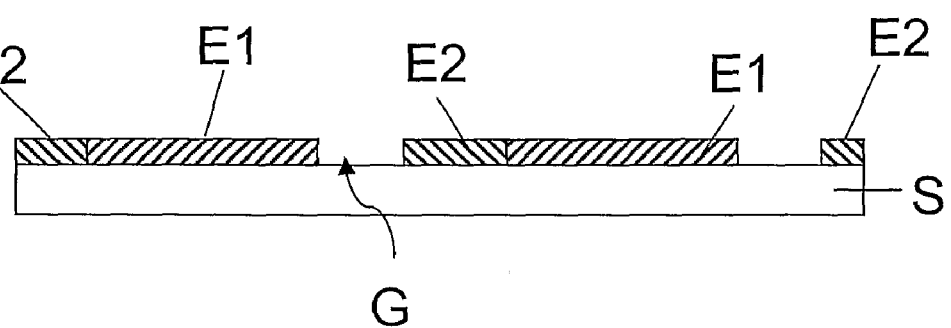
Figure 10:
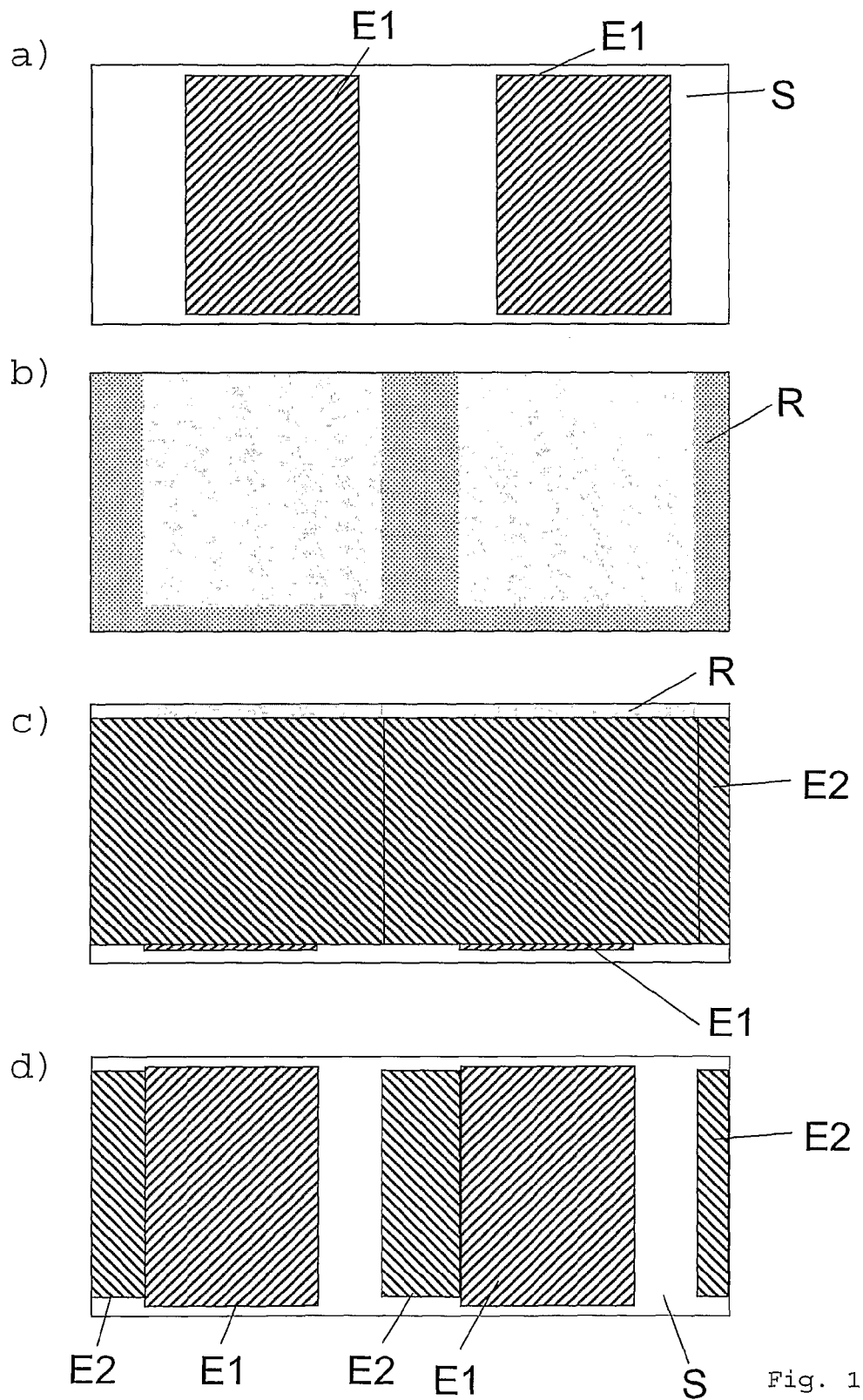
FIG. 10 shows the schematic representation of FIG. 9 in top view.

FIGS. 9 and 10 show schematic representations of the fabrication of an organic photo diode (oPD) by the method of the invention in sectional view and in top view. In a first step (FIGS. 9a and 10a) a coarse contact is deposited as a first layer E1 on the upper surface of the substrate S. The shape of the pattern in which the first layer E1 is deposited does not have to satisfy any geometrical restrictions. Preferably, the edges/ridges/borders of adjacent parts of the first layer E1 are parallel to each other. The substrate S is at least partially transparent to a light beam L, which is preferentially a UV light beam. The first layer E1 is, however, opaque to the light beam L. The first layer E1 is patterned preferably by techniques that are compatible with high throughput fabrication methods such as patterning methods which include gravure and ink-jet printing.

In a next step a photosensitive layer R, that can be for example a positive photosensitive polymer or resist, is applied (FIGS. 9b and 10b). The applied photosensitive layer R is preferably a homogeneous thin film. The thickness of the photosensitive layer R can range from a few 100 nanometers to a few micrometers. The photosensitive layer R is sensitive to the light beam L, in particular to UV-radiation. For applying the photosensitive layer R, deposition techniques are preferred that are compatible with high throughput fabrication methods, e.g. gravure printing or screen printing. After deposition and thermal curing of the photosensitive layer R, it is exposed to a light beam L to which it is sensitive, in particular to UV-radiation. The light beam L impinges under an oblique angle of incidence on the lower surface of the substrate S. The first layer E1 is opaque to the light beam L and shadows or shields, respectively, the incident light beam L as schematically depicted in FIG. 9b.

After exposure, the photosensitive layer R is immersed in or flooded by a developer solution. The exposed regions of the photosensitive layer R are thereby removed. The oblique exposure results in an overhang at the ridge/edge of the first layer E1 in the direction of incidence of the light beam L as shown in FIG. 9c.

Then a second conductive layer E2 is deposited such that parts of it cover parts of the substrate S and the remaining photosensitive layer (FIGS. 9c and 10c). As second layer E2 a thin film of the same material as used for the first layer E1 is preferably employed. The second layer E2 is preferentially deposited by a technique that sustains a high throughput such as physical vapor deposition (PVD), in particular evaporation and/or sputtering and/or printing, in particular gravure or screen printing, for instance.

In a next step, the remaining region of the photosensitive layer R is removed by dissolution in an appropriate solvent. The second layer E2 is thereby lifted off in the area where it covered the remaining region of the photosensitive layer R (confer FIG. 9c). The removal of the remaining region of the photosensitive layer R that is covered by the second layer E2 results in a small gap G between a part of the first layer E1 and a part of the (remaining) second layer E2, in particular the gap G lies next to that edge/ridge of a part of the first layer E1 that is further apart from the light source of the light beam L than its other edge/ridge. The edge/ridge of a part of the first layer E1 that is closer to the light source merges with (i.e. is in direct contact with) a part of the second layer E2. This concludes the forming of the organic photo diode (oPD). The dimension of the gap G is defined as the distance between the adjacent ridges/edges of the first and the second layer. The gap length is preferentially of submicron size and is determined by the thickness of the photosensitive layer R and the angle of incidence φ of the light beam L.

Thus, an organic photo diode with a high fill factor can be fabricated with a method according to the invention which is compatible with a roll-to-roll fabrication process. The (film) thickness of the photosensitive layer R and the angle of incidence of the light beam L during exposure constitute the two robust process parameters by which the separation between the parallel electrical contacts given by the conductive layers E1, E2 (or parts thereof) can be adjusted in the submicron range. Therefore, one can advantageously do without the state of the art high resolution patterning methods. Of course, other electronic devices may also be fabricated by the method according to the invention.

Furthermore, the method according to the invention can e.g. be used to fabricate an organic field-effect transistor (oFET) which in particular comprises parallel aligned source and drain electrodes, which are separated by a gap, the gap preferably being in the submicron range. Also the fabrication of the organic field-effect transistor (preferably with consecutive parallel and sub-micrometer spaced electrodes given by conductive layers or parts thereof) involves as process parameters primarily the thickness of the applied photosensitive layer R and the angle φ of incidence of the light beam L.

Figure 11:
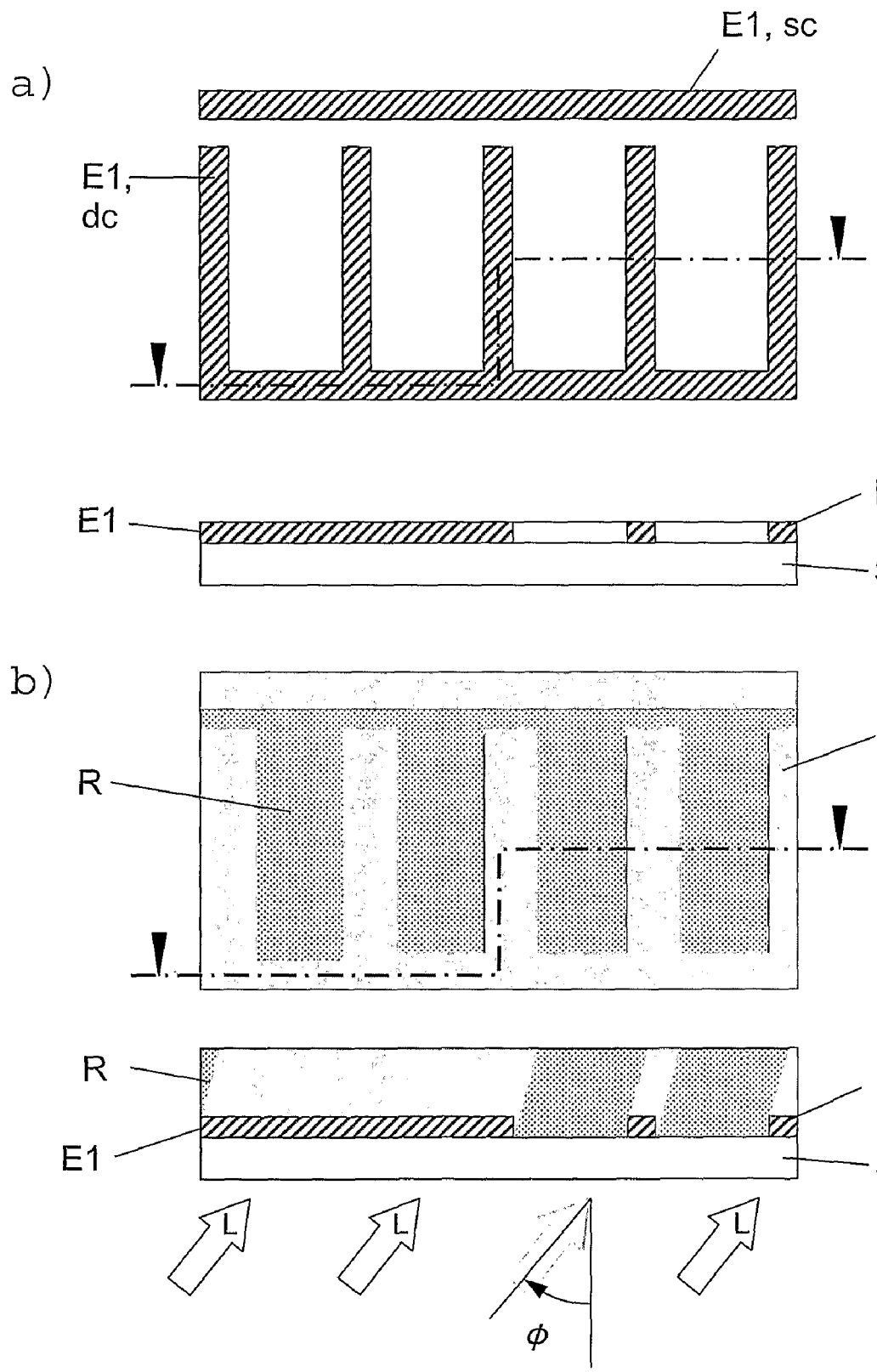
FIG. 11 shows a schematic representation of the fabrication of an organic field effect transistor in top view and in sectional view along a dash-dotted line of the top view.
Figure 11:
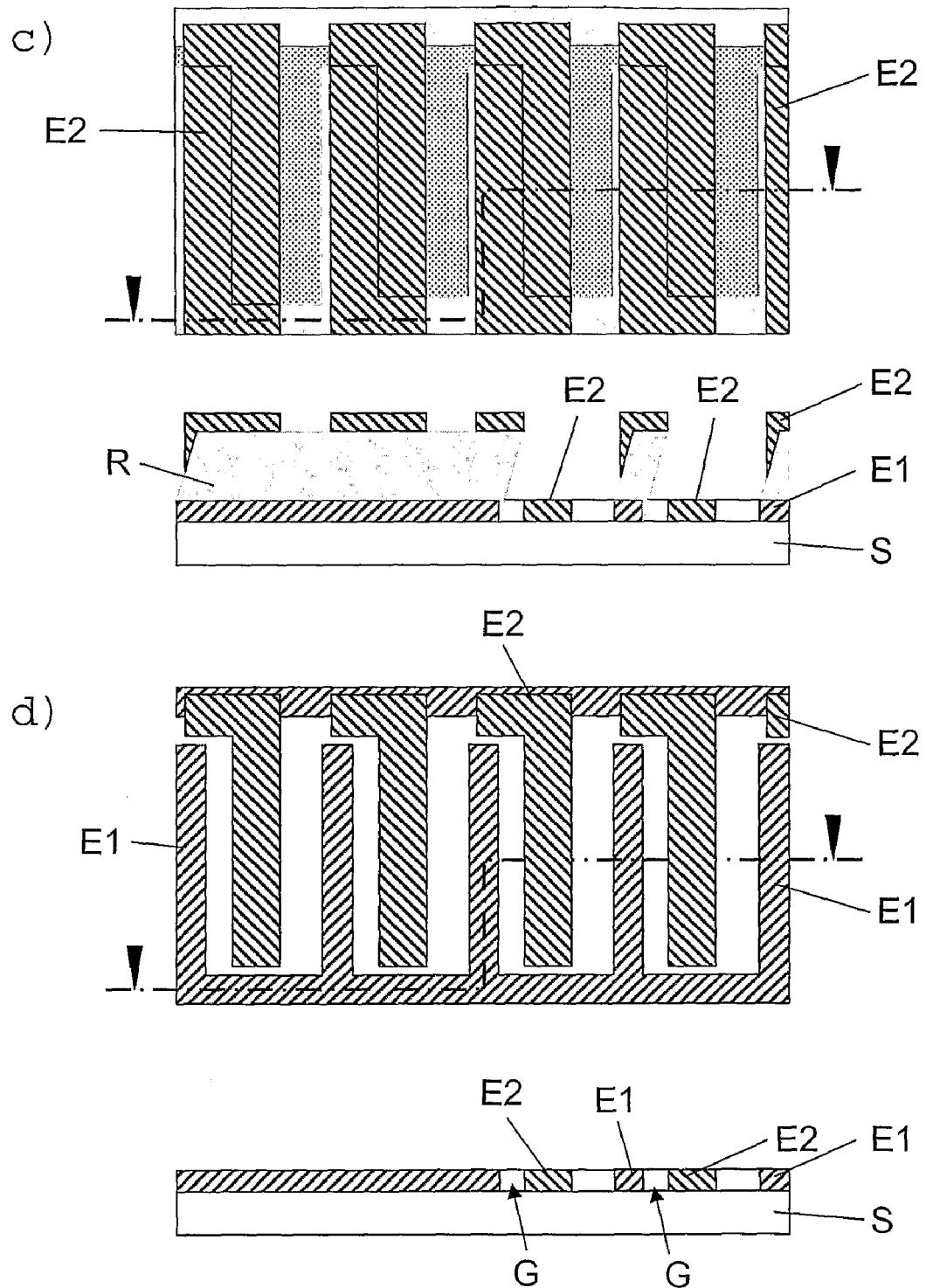
Figure 11:
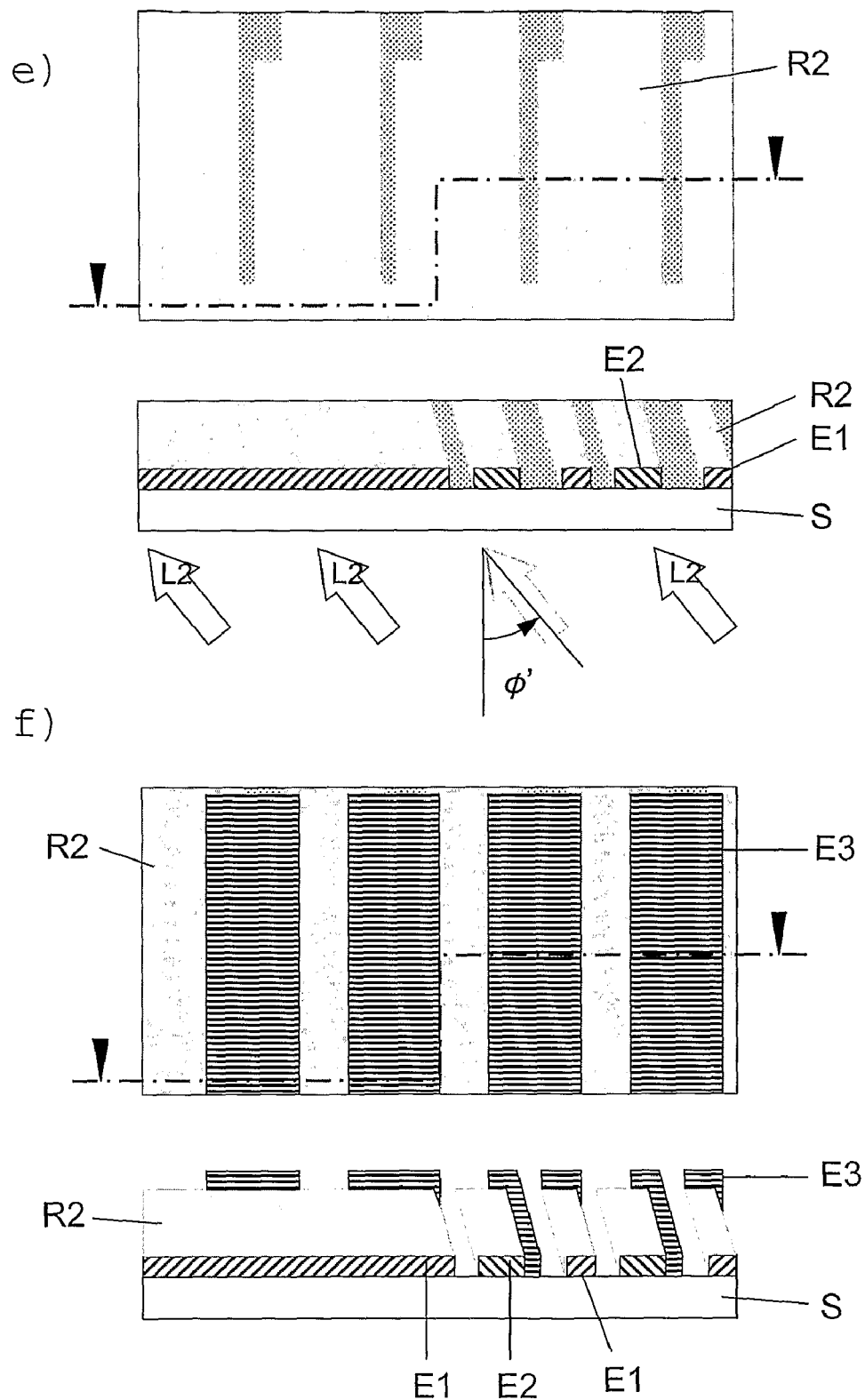
Figure 11:
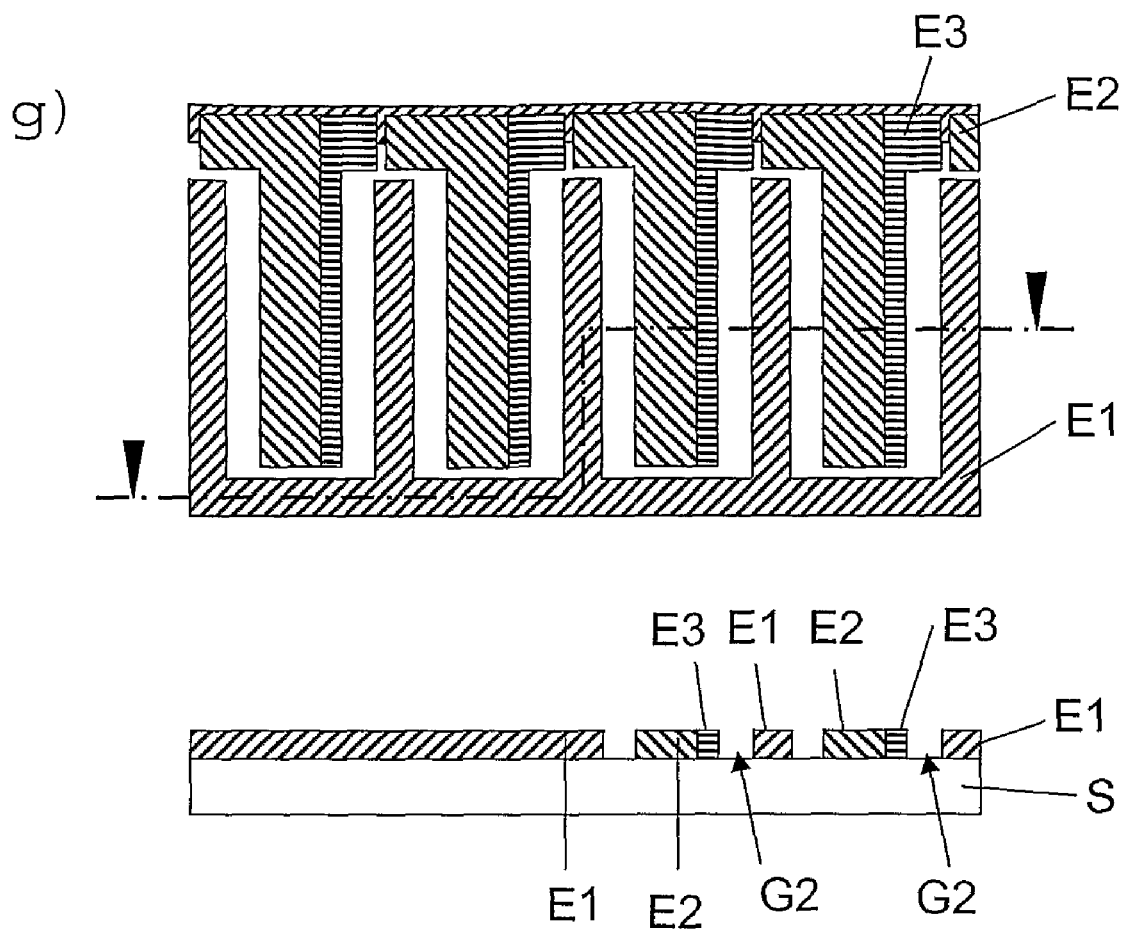

An organic field-effect transistor comprises interdigitated conductive channels arranged in a parallel pattern and separated in the submicron range, which can be formed by the method according to the invention. Fabrication of an organic field-effect transistor by the method of the invention comprises the steps of depositing a first conductive and opaque layer on the upper surface of a transparent substrate, depositing a photosensitive layer such that it covers at least the edges of and the openings in the first layer, exposing the photosensitive layer to a light beam, the light beam impinging on the lower surface of the substrate under an oblique angle of incidence (e.g. from the lower left to the upper right side as seen by the viewer of FIG. 11—or vice versa according to another embodiment), removing the exposed parts of the photosensitive layer while leaving a remaining part of the photosensitive layer which at each edge of the parts of the first layer constitutes an overhang, depositing a second conductive layer such that it covers at least the particular parts of the photosensitive layer that form the overhang, removing the remaining photosensitive layer thereby obtaining a gap (preferably in the submicron range) between an edge of the first layer and an edge of the next second layer, being a reproduction of the first layer. The mentioned steps (apart from the deposition of the first layer E1) are then repeated but during the exposure of the now applied photosensitive layer to a light beam, the angle of incidence is vertically mirrored, i.e. if the angle of incidence for the first exposure is φ and the angle of incidence for the second exposure is φ', then φ'=−φ.

FIG. 11 shows schematic representations of the fabrication of an organic field effect transistor (oFET) by the method of the invention. In each of the subfigures of FIG. 11 (e.g. FIG. 11a) at the top a top view is depicted, while at the bottom a sectional view along the dash-dotted line of the top view is depicted.

In a first step (FIG. 11a) a first conductive layer E1 is deposited on the upper side of a substrate S in a pattern constituting the drain contact (dc) and the source contact (sc). The drain contact (dc) is given by an interdigitated contact and the source contact (sc) is given by a horizontal bar.

The substrate S is at least partially transparent to a light beam L (in particular an UV-light beam) used for the lithography process. The first layer E1 is, however, opaque to the light beam L. The first layer E1 is preferably patterned with techniques that are compatible with high volume fabrication methods (confer above description).

In a next step a photosensitive layer R, that can for example be a positive photosensitive polymer or resist, is applied (FIG. 11b). The applied photosensitive layer R is preferentially a homogenous thin film and can vary in thickness from a few 100 nanometers to a few micrometers. The photosensitive layer R is sensitive to the light beam L, in particular to UV-radiation. After curing, the photosensitive layer R is exposed to a light beam L, to which its material is sensitive. The light beam L impinges under an oblique angle φ of incidence (exemplarily from the lower left to the upper right side as seen by the viewer of FIG. 11) on the lower surface of the substrate S. The first layer E1 being opaque shades or shields, respectively, the light beam L as schematically shown in FIG. 11b.

After exposure the photosensitive layer R is immersed in or flooded by a developer solution. The exposed region of the photosensitive layer R is thereby removed. Due to the oblique exposure the remaining region of the photosensitive layer comprises overhangs at the edges of parts of the first layer in the direction of incidence of the light beam L as depicted in FIG. 11b. The overhangs appear at those edges of the different parts of the first layer E1 that are further away from the light source as their opposing edges.

In the next step shown in FIG. 11c a second conductive layer E2 is deposited such that parts of it cover the remaining photosensitive layer R and parts of the substrate that are not shadowed by the overhangs and that are spaced apart from the first layer E1. Hence, the second layer E2 is deposited in a distance from the left edges/ridges (as seen by a viewer of FIG. 11c) of the patterned first layer E1. As second layer E2 a thin film of the same conductive material can be used as for the first layer E1.

In a next step, the remaining region of the photosensitive layer R is removed by dissolution in an appropriate solvent. The second layer E2 is thereby lifted off in the area where it covers the remaining region of the photosensitive layer R (FIG. 11d). The removal of the remaining region of the photosensitive layer R covered by the second layer E2 results in a small gap G defined by the right edge of the patterned first layer E1 and the left edge of the second layer E2 (as seen by the viewer of FIG. 11d). The gap size, which is the distance between the parallel, adjacent edges of parts of the first and the second layer, is determined by the film thickness of the photosensitive layer R and the angle φ of incidence of the light beam L on the substrate S.

The above steps, which are described with respect to the FIGS. 11b) to 11d), are then repeated in the same order to create a gap G2, preferable in the submicron range, also on the left side of the parts of the first layer E1 (as seen from the viewer of FIG. 11). Hence, a further photosensitive layer R2 is deposited (under basically the same conditions as before the first photosensitive layer R) on the upper surface of the substrate S such that it covers at least the left edges (as seen by the viewer of FIG. 11e) of parts of the first layer E1 (FIG.

11e). This photosensitive layer R2 is then exposed to a light beam L2 under basically the same conditions as the first photosensitive layer R had been exposed to the light beam L except for the angle φ' of incidence. The light beam L2 impinges oblique on the lower surface of the substrate S under an angle φ' of incidence that is equal to the angle φ of the light beam L but mirrored at the vertical. Thus, angle φ' is equal to the negative value of the angle φ of the light beam L.

In a next step, the exposed region of the second photosensitive layer L2 is removed by a developer solution. The remaining region of the photosensitive layer L2 which comprises overhangs in the direction of incidence at the left edges (as seen by the viewer of FIG. 11f) of the parts of the first layer E1 is covered by a third conductive layer E3 (FIG. 11f). The third conductive layer E3 is preferably deposited such that it covers an area comprising at least the surface of the overhang over the parts of the first layer E1, the right edge of the parts of the second layer E2 and the area in-between (as seen by a viewer of FIG. 11f). The third layer E3 has a thickness that allows its lifting off when removing the remaining region of the second photosensitive layer R2. While removing the remaining region of the second photosensitive layer R2 in the following step (FIG. 11g) parts of the third conductive layer E3 are lifted off leading to a gap G2, which is preferably in the submicron range, at the left edges/ridges of the parts of the first layer E1 (as seen by the viewer of FIG. 11g). The gap G2 depicted in FIG. 11g) is even smaller than the gap G depicted in FIG. 11d) due to the introduction of parts of the third conductive layer E3 into the gap G tangentially next to the right edge of the parts of the second layer E2 (as seen by a viewer of FIG. 11g).

While there are shown and described presently preferred embodiments of the invention, it is to be distinctly understood that the invention is not limited thereto but may be otherwise variously embodied and practiced within the scope of the following claims.

The invention claimed is:

1. A method for forming a pattern on a substrate (S) with an upper surface and a lower surface comprising the following steps:
    depositing a first layer (E1) on one or more parts of the upper surface of the substrate (S), the material of the first layer (E1) being opaque,
    depositing a photosensitive layer (R) directly on the at least one part of the first layer such that part of the photosensitive layer (R) covers at least part of the first layer (E1),
    exposing the photosensitive layer (R) to a light beam (L), the light beam (L) impinging on the lower surface of the substrate (S) under an oblique angle (φ) of incidence,
    removing the exposed region of the photosensitive layer (R),
    depositing a second layer (E2) such that part of the second layer (E2) covers a remaining region of the photosensitive layer (R), wherein the second layer (E2) has a thickness that allows its lifting off when removing at least a part of the remaining region of the photosensitive layer (R), and
    removing at least a part of the remaining region of the photosensitive layer (R.

2. The method of claim 1 wherein in the last step the remaining region of the photosensitive layer (R) is removed by dissolution.

3. A method for forming a pattern on a substrate (S) with an upper surface and a lower surface comprising the following steps:
    depositing a first layer (E1) on one or more parts of the upper surface of the substrate (S), the material of the first layer (E1) being opaque,
    depositing a photosensitive layer (R) directly on the at least one part of the first layer such that part of the photosensitive layer (R) covers at least part of the first layer (E1),
    exposing the photosensitive layer (R) to a light beam (L), the light beam (L) impinging on the lower surface of the substrate (S) under an oblique angle (φ) of incidence,
    removing the exposed region of the photosensitive layer (R),
    applying plasma (P) by anisotropic etching from above the upper surface of the substrate (S), and
    depositing a second layer (E2).

4. A Method for forming a thin-film field effect transistor comprising the following steps:
    forming a source electrode (SE) and a drain electrode (DE) on a substrate (S) by applying the method according to claim 1, wherein either the source electrode (SE) represents the first layer (E1) and the drain electrode (DE) represents the second layer (E2) or vice versa,
    depositing a semiconductor layer (SC),
    depositing an insulator layer (I) on the semiconductor layer (SC),
    forming a gate electrode (GE) on the insulator layer (I).

5. Electronic device, comprising
    a substrate (S) with an upper surface and a lower surface, said substrate (S) being transparent to a light beam (L),
    a first layer (E1) and a second layer (E2) located adjacent to each other on the upper surface of the substrate (S), wherein at least a part of the first layer (E1) and at least a part of the second layer (E2) are spaced apart by a gap (G; G2) and wherein the first layer (E1) is opaque with respect to the light beam (L), and wherein the size of the gap (G; G2) is below 3 μm.

6. Electronic device according to claim 5, wherein the size of the gap (G; G2) is in the submicron rage.

7. Electronic device according to claim 5, wherein the first layer (E1) and the second layer (E2) comprise several parts with parallel edges and wherein the gaps (G; G1) separating at least some of these parts are parallel to each other.

8. Electronic device according to claim 5, wherein the substrate (S) comprises glass and/or polymer foil as material.

9. Electronic device according to claim 5, wherein the first layer (E1) comprises aluminium, platinum, gold, nickel, NiCr alloys and/or conducting polymers and/or organic conductors as material.

10. Electronic device according to claim 5, wherein the gap (G; G2) is electrically isolating.

11. Electronic device according to claim 5, which constitutes an organic photo diode.

12. Electronic device according to claim 5, which constitutes an organic field-effect transistor.

13. Electronic device according to claim 5, which constitutes an organic solar cell.

14. A Method for forming a thin-film field effect transistor comprising the following steps:
    forming a gate electrode (GE) on a substrate (S),
    depositing an insulator layer (I),
    forming a source electrode (SE) and a drain electrode (DE) on the insulator layer (I) by applying the method according to claim 3, wherein either the source electrode (SE) represents the first layer (E1) and the drain electrode (DE) represents the second layer (E2) or vice versa,
    depositing a semiconductor layer (SC).

15. A Method for forming a thin-film field effect transistor comprising the following steps:

forming a source electrode (SE) and a drain electrode (DE) on a substrate (S) by applying the method according to claim 3, wherein either the source electrode (SE) represents the first layer (E1) and the drain electrode (DE) represents the second layer (E2) or vice versa, depositing a semiconductor layer (SC), depositing an insulator layer (I) on the semiconductor layer (SC), forming a gate electrode (GE) on the insulator layer (I).

* * * * *